United States Patent
Garandet et al.

(10) Patent No.: US 10,287,703 B2
(45) Date of Patent: May 14, 2019

(54) SUBSTRATE WITH LOW-PERMEABILITY COATING FOR THE SOLIDIFICATION OF SILICON

(71) Applicant: COMMISSARIAT A L'ENERGIE ATOMIQUE ET AUX ENERGIES ALTERNATIVES, Paris (FR)

(72) Inventors: Jean-Paul Garandet, Le Bourget du Lac (FR); Denis Camel, Chambery (FR); Béatrice Drevet, Grenoble (FR); Nicolas Eustathopoulos, Grenoble (FR); Charles Huguet, Paris (FR); Johann Testard, Veyrier du Lac (FR); Rayisa Voytovych, Echriolles (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/022,461

(22) PCT Filed: Sep. 12, 2014

(86) PCT No.: PCT/IB2014/064472
§ 371 (c)(1),
(2) Date: Mar. 16, 2016

(87) PCT Pub. No.: WO2015/036974
PCT Pub. Date: Mar. 19, 2015

(65) Prior Publication Data
US 2016/0222542 A1   Aug. 4, 2016

(30) Foreign Application Priority Data
Sep. 16, 2013 (FR) .................. 13 58900

(51) Int. Cl.
*C30B 11/00* (2006.01)
*C01B 33/021* (2006.01)
(Continued)

(52) U.S. Cl.
CPC .......... *C30B 11/002* (2013.01); *C01B 33/021* (2013.01); *C04B 41/009* (2013.01);
(Continued)

(58) Field of Classification Search
CPC ..... C30B 11/002; C30B 29/06; C01B 33/021; C04B 41/009; C04B 41/5035;
(Continued)

(56) References Cited

U.S. PATENT DOCUMENTS 5,147,801 A * 9/1992 Suzuki .................. C12M 23/04
428/34.3
5,361,625 A    11/1994 Ylvisaker
(Continued)

FOREIGN PATENT DOCUMENTS

CN    101844935 A    9/2010
EP    1 821 093 A2    8/2007
(Continued)

OTHER PUBLICATIONS

Apr. 25, 2017 Office Action issued in Chinese Patent Application No. 201480050801.7.
(Continued)

*Primary Examiner* — Jonathan C Langman
(74) *Attorney, Agent, or Firm* — Oliff PLC

(57) ABSTRACT

A substrate characterised in that it is at least partially surface-coated with a coating containing at least one so-called "barrier" layer having silica and one or more material(s) X selected from among SiC, Si, $Si_3N_4$, in which layer the amount of X varies between 25-wt. % and 50.-wt. % in relation to the total weight of the barrier layer, the
(Continued)

barrier layer being formed by grains of one or more materials X covered at least partially in a silica shell, and the barrier layer being in direct contact with the substrate.

16 Claims, 1 Drawing Sheet

(51) Int. Cl.
*C30B 29/06* (2006.01)
*C04B 41/87* (2006.01)
*C04B 41/89* (2006.01)
*C04B 41/00* (2006.01)
*C04B 41/50* (2006.01)
*C04B 41/52* (2006.01)
*C09D 1/00* (2006.01)
*C04B 111/00* (2006.01)

(52) U.S. Cl.
CPC .......... *C04B 41/5035* (2013.01); *C04B 41/52* (2013.01); *C04B 41/87* (2013.01); *C04B 41/89* (2013.01); *C09D 1/00* (2013.01); *C30B 29/06* (2013.01); *C04B 2111/00879* (2013.01)

(58) Field of Classification Search
CPC .......... C04B 41/52; C04B 41/87; C04B 41/89; C04B 2111/00879; C09D 1/00
See application file for complete search history.

(56) References Cited

U.S. PATENT DOCUMENTS

2007/0240635 A1* 10/2007 Rancoule ............... C30B 15/10
  117/208
2012/0208690 A1* 8/2012 Cortellini ............... C30B 15/10
  501/153

FOREIGN PATENT DOCUMENTS

| WO | 2005/106084 A1 | 11/2005 |
| WO | 2014/004496 A1 | 1/2014 |
| WO | 2014/004496 A9 | 2/2015 |

OTHER PUBLICATIONS

Dec. 15, 2014 Search Report issued in International Patent Application No. PCT/IB2014/064472.
Dec. 15, 2014 Written Opinion issued in International Patent Application No. PCT/IB2014/064472.

* cited by examiner

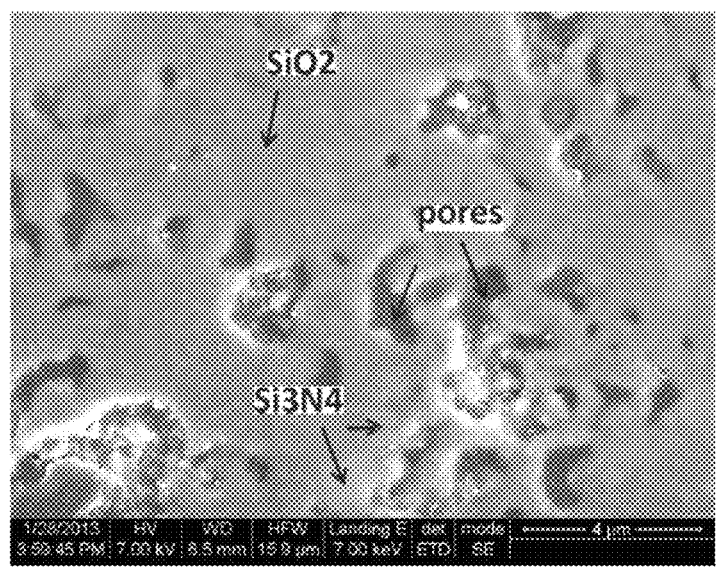

SUBSTRATE WITH LOW-PERMEABILITY COATING FOR THE SOLIDIFICATION OF SILICON

The present invention relates to a substrate having a particular coating, intended to be brought into contact with a molten silicon.

The present invention relates more particularly to a crucible of use for solidifying a silicon ingot from silicon in the molten state.

It also relates to a process for preparing such a crucible and also to the use of such a crucible for solidifying silicon.

The crucibles according to the invention may in particular be used in processes for melting and solidifying silicon, for the purposes for example of obtaining highly pure silicon for applications in the generation of photovoltaic energy. Thus, photovoltaic cells are essentially fabricated from monocrystalline or polycrystalline silicon obtained from the solidification of liquid silicon in crucibles. It is the wafers cut from the ingot formed within the crucible that serve as a basis for the fabrication of the cells.

The crucibles considered for the growth of the ingot are generally silica crucibles, coated with a layer of silicon nitride oxidized so as to prevent adhesion of the ingot to the crucible after solidification.

More specifically, the release behavior is based essentially on the presence of silicon nitride, $Si_3N_4$, in the form of oxidized powders, at the surface of the internal walls of the crucibles to which the silicon adheres during cooling thereof. When cooling, the silicon ingot detaches from these walls by cohesive rupture within the silicon nitride layer, thus relaxing the mechanical stresses resulting from the difference in thermal expansion coefficients.

However, this technique does not make it possible to prevent contamination of the silicon by the impurities present in the silicon nitride powder.

In addition, this coating may not be used on all types of crucibles, in particular on crucibles made of ceramic, such as silicon carbide or nitride. This is because, since the ceramics are chemically reducing, they will have the effect of deoxidizing the coating, which may result in delamination of the latter.

A natural solution would be to produce a barrier layer of silica in order to prevent the gases produced during the heat treatment from escaping and thus to prevent delamination of the coating. Unfortunately, the differential dilation phenomenon means that a layer of pure silica does not withstand thermal cycling.

Moreover, owing to transformations in shape and structure during the silicon melting-solidifying cycle, the crucibles used industrially are not always reusable.

Consequently, there remains at the current time a need for substrates, in particular for crucibles, which have a coating that provides a gas-tight barrier, these substrates being capable of undergoing several consecutive thermal cycles and, in this respect, being reusable.

There also remains a need for substrates, in particular for crucibles, which allow easy detachment of the silicon ingot after cooling thereof, while at the same time limiting the contamination of this ingot by the release coating.

Finally, in the perspective of an industrial-scale production, it is desirable to have a process for manufacturing crucibles by means of inexpensive techniques which only require a few implementation steps.

The present invention aims precisely to provide novel substrates, in particular novel crucibles, of use for solidifying a silicon ingot from silicon in the molten state, which meet these needs.

Thus, the present invention relates to a substrate at least partially surface-coated with a coating containing at least one layer, termed "barrier" layer, comprising silica and one or more material(s) X chosen from SiC, Si and $Si_3N_4$, in which layer the weight amount of X ranges from 25% to 50% relative to the total weight of the barrier layer, said barrier layer being formed from grains of one or more materials X covered at least partially with a silica shell, the barrier layer being placed in direct contact with the substrate.

Surprisingly and advantageously, the inventors have in fact discovered that the problems developed above may be solved by at least partially covering the surface of a substrate intended to contain or support molten silicon, with a low-permeability coating formed from silica and from one or more material(s) X chosen from SiC, Si and $Si_3N_4$, in predetermined proportions.

The coating formed in the context of the present invention, in which the barrier layer is in direct contact with the substrate, i.e. there is no intermediate layer between the substrate and the barrier layer, is advantageous in several respects. It simultaneously shows good substrate-adhesion properties and satisfactory gas-"barrier" properties.

FIG. 1 shows a coating in the form of a matrix of $SiO_2$ into which are incorporated nonoxidized grains of $Si_3N_4$, obtained at the end of example 1.

The expressions "of between . . . and . . . " and "ranging from . . . to . . . " are equivalent and, unless otherwise mentioned, should be understood to mean limits included.

According to one variant, said coating is constituted by said barrier layer.

According to this implementation, the barrier layer constitutes the external layer of the substrate, in direct contact with the atmosphere or the container of the substrate, i.e. the barrier layer is not covered with an additional layer.

According to another variant, said coating is formed only partly by the barrier layer on which an ancillary layer may be superposed, said ancillary layer preferably being a release layer.

Said tie layer is then advantageously obtained by oxidizing the external surface of the barrier layer.

According to a first variant, the coating formed according to the present invention comprises at least one barrier layer formed from grains of one or more materials X covered at least partially with a silica shell.

In this case, the cohesion of the grains is generally obtained by sintering the silica.

According to another variant, the coating formed according to the present invention comprises at least one barrier layer which is in the form of a silica matrix into which are incorporated grains of one or more material(s) X.

More particularly, the grains of one or more material(s) X are at least partially coated with a nanometric layer of silica.

Advantageously, the thickness of the "barrier" layer is between 10 and 100 μm, between 20 and 50 μm.

With regard to the silica shell, i.e. the silica layer formed at the surface of the grains of material(s) X, it may have a thickness ranging from 2 to 100 nm, and in particular from 10 to 30 nm. Advantageously, the substrate is a crucible, in particular of use for solidifying silicon.

It may also be a part of a crucible which, by assembly with one or more other parts, precisely makes it possible to form said crucible.

The presence of the coating according to the invention makes it possible to obtain a crucible which is reusable with the proviso solely of depositing the ancillary layer, i.e. without requiring one or more pretreatment steps before reuse.

Other characteristics and advantages of the invention will emerge more clearly from the description which follows. This description corresponds to a particular embodiment of the invention and is given purely by way of nonlimiting illustration.

As previously indicated, the substrate according to the invention is at least partially, and preferably entirely, surface-coated with a coating formed from at least one "barrier" layer.

From the viewpoint of its composition and its permeability, the barrier layer according to the invention makes it possible to preserve the integrity of the substrate.

Without wishing to be linked to any theory, it appears that the gaseous products that may be generated at the substrate/barrier layer interface, during the heat treatments (SiO, CO), will not be able to evacuate through the coating. The problems associated with delamination of the coating and with its infiltration by the liquid silicon during the various cycles are thus dispensed with.

Thus, the barrier layer comprises, or even consists of, silica and one or more material(s) X chosen from SiC, Si and $Si_3N_4$, and is such that the weight amount of X in the barrier layer ranges from 25% to 50% relative to the total weight of the barrier layer.

Consequently, the weight amount of silica in the barrier layer advantageously ranges from 50% to 75% relative to the total weight of the barrier layer.

According to a first variant of the invention, the barrier layer comprises, or even consists of, a mixture of silica and of silicon carbide (SiC).

According to a second variant of the invention, the barrier layer comprises, or even consists of, a mixture of silica and silicon (Si).

According to a third preferred variant of the invention, the barrier layer comprises, or even consists of, a mixture of silica and silicon nitride ($Si_3N_4$).

According to a fourth variant of the invention, the barrier layer comprises, or even consists of, a mixture of silica and two materials X chosen from SiC, Si and $Si_3N_4$.

According to a fifth variant of the invention, the barrier layer comprises, or even consists of, a mixture of silica and the following three materials X: SiC, Si and $Si_3N_4$.

The particles of inorganic materials X used in the process for preparing the coating according to the invention, as subsequently described more particularly, are preferably in the form of powders, preferably having a size or an average diameter ranging from 500 nm to 5 microns, preferably from 0.8 micron to 2 microns.

According to one implementation variant, they may be commercially available powders. By way of example of such powders. mention may be made of silicon nitride ($Si_3N_4$) in the form of grains of micronic size and sold under the reference SNE10® by the company UBE.

According to another implementation variant, the particles of inorganic materials X may be prepared prior to the formation of the coating according to the invention. Those skilled in the art are able to carry out the methods appropriate for preparing the particles suitable for the invention.

Advantageously, the permeability of the barrier layer is less than $10^{-15}$ $m^2$, preferably less than $10^{-18}$ $m^2$.

The permeability of this layer reflects its ability to allow a reference fluid to pass through it under the effect of a pressure gradient.

The (intrinsic or specific) permeability of a substrate, and more generally of a medium, may be obtained from the Darcy equation:

$$u = -\frac{K}{\mu}\frac{\partial P}{\partial x}.$$

in which $\partial P/\partial x$ is the pressure gradient in the direction of the flow and $\mu$ is the dynamic viscosity of the fluid.

Thus, the intrinsic or specific permeability K is independent of the nature of the fluid, but depends on the geometry of the medium, and is expressed in $m^2$. In the case of a single-phase flow, the intrinsic or specific permeability K is simplified to "permeability".

The permeability is measured by means of a permeameter as described in U.S. Pat. No. 5,361,625 or in patent application EP 1 821 093 A2.

These permeameters are devices for measuring permeation of gas through a material (M); they comprise a permeation chamber comprising a first and a second chamber separated by a material (M). The material M corresponds to the material of which it is sought to measure the permeability.

Generally, a gas or mixture of gases is introduced into the first chamber and then collected in the second chamber where they are analyzed by an appropriate detector. The process of permeation of a gas through a material is based on the differences in partial pressures of this gas, also called permeate, on either side of the material M. The partial pressure of each of the gases having passed through the sample increases until it stabilizes when the material M is saturated with permeate.

The permeability of the material to the gas under consideration is thus calculated from the permeation flow, taking into account the thickness of the sample.

The barrier layer preferentially has the property of having a very low porosity: it has an open porosity ranging from 0 to 5%, preferably ranging from 0 to 2%.

This porosity may be measured using the SEM image analysis method.

In the case of a porosity of less than 2%, the coating may be described as a coating with a substantially closed porosity.

In addition, advantageously, the specific surface area of the barrier layer is between 5 $cm^2/g$ and 5 $m^2/g$, in particular between 100 $cm^2/g$ and 1 $m^2/g$.

According to one preferred mode of the invention, the coating also comprises, at the surface of the barrier layer, a release layer, generally a conventional release layer.

This release layer may be advantageously obtained by oxidizing the external surface of the barrier layer, in particular by annealing under air at a temperature ranging from 600° C. to 900° C.

Said release layer is particularly advantageous when the substrate is intended for the formation of silicon ingots from molten silicon.

Contrary to the barrier layer, the release layer is porous.

It is within the competence of those skilled in the art to adjust the duration and the temperature of the oxidizing annealing step making it possible to obtain an appropriate release surface.

Process

According to another of its aspects, the invention aims to provide a process for preparing a substrate according to the invention, at least partially surface-coated with a coating forming a gas barrier, said process comprising at least the steps consisting in:

a) providing a fluid medium comprising one or more material(s) X chosen from SiC, Si and $Si_3N_4$;
b) applying said fluid medium to the surface of the substrate in a sufficient amount to form a deposit thereon,
c) treating said deposit under an oxidizing atmosphere, at a temperature of between 1000° C. and 1300° C. and under conditions sufficient to form a "barrier" layer comprising silica and one or more material(s) X chosen from SiC, Si and $Si_3N_4$, in which layer the weight amount of X ranges from 25% to 50% relative to the total weight of the barrier layer, said barrier layer being formed from grains of one or more materials X covered at least partially with a silica shell, the barrier layer being placed in direct contact with the substrate.

More particularly, the substrate is a crucible at least partially coated on its internal surface.

More particularly, the fluid medium used in step a) comprises one or more material(s) X in an amount ranging from 15% to 35% by weight relative to the total weight of said fluid.

Advantageously, the fluid medium used in step a) comprises silica.

Thus, the amount of silica in the fluid medium may range from 0% to 15% by weight relative to the total weight of said fluid. It preferably has a size or average diameter of less than 2 microns.

The permeability of the barrier layer is advantageously less than $10^{-15}$ $m^2$; it may be controlled by the morphology of the initial powders and the characteristics of the heat treatments used.

The material(s) X present in the fluid medium are generally silicon derivatives in the form of powders.

The material(s) X generally have a size of about 1 micron. Generally, the powders of silicon derivatives X have a size ranging from 500 nm to 5 microns, preferably from 0.8 micron to 2 microns.

The liquid medium used in step a), in addition to the inorganic material(s) X and optionally the silica, advantageously contains an effective amount of at least one organic binder.

The function of such a compound is generally to facilitate the application of the liquid mixture of coating using conventional equipment.

Thus, the organic binder under consideration in the context of the present invention may be chosen from polyvinyl alcohol, polyethylene glycol or else carboxymethylcellulose.

For example, the ratio of the "silica and material X" mixture/binder(s) may be at least 3:1 and more particularly 5:1.

The fluid medium also generally comprises water.

Generally, the fluid medium intended for forming the coating in accordance with the invention combines from 0 to 20% by weight of at least one binder relative to the total weight of the fluid medium, and from 10% to 50% by weight of a mixture of silica and inorganic material(s) X relative to the total weight of the liquid medium, the remainder to 100% by weight being water.

This mixture may of course contain other additives intended either to improve these qualities at the time of spraying and/or application, or to confer required supplementary properties on the corresponding coating.

They may for example be dispersants.

The liquid medium used in step a) is generally a slip consisting of one or more inorganic material(s) X, water and optionally silica and at least one binder.

The slip is generally presieved by passing it through a mill in order to reduce the powder agglomerates.

The process according to the invention comprises a step b) of applying the fluid medium to the surface to be treated in a sufficient amount to form a deposit.

The use of a fluid medium makes it possible to produce a deposit having a very good surface finish.

For example, such a gun, fitted with 0.4 mm nozzle, may be used at a compressed air pressure of 2.5 bar.

This application of the liquid coating mixture may also be carried out by means of other modes of application, such as, for example, a brush, or else by dipping the parts in a bath.

These application techniques are clearly within the competence of those skilled in the art and are not described herein in detail.

The application of the fluid mixture intended to form the coating may be carried out at ambient temperature or at a higher temperature. The surface to be treated may be heated so as to be conducive to rapid drying of the coating layer applied.

In this embodiment, at least the surface to be treated, or even all of the material, may be heated at a temperature ranging from 25 to 80° C., in particular from 30 to 50° C., thus resulting in evaporation of the solvent.

The liquid mixture intended to form the coating is applied at the surface of the surface to be treated with a thickness suitable for preventing any cracking during drying, for example between 20 and 100 μm.

If necessary, it is possible to carry out one or more other deposit(s) of fluid mixture on the first deposit formed at the end of step (b). In this case, the other, subsequent, deposit(s) will take place after application and drying of the first deposit.

Thus, according to one particular mode of the process according to the invention, step b) is repeated several times before step c) is carried out.

According to another particular mode, the process according to the invention comprises, between step b) of forming a deposit and step c) of treating under an oxidizing atmosphere, at least one step of drying at a temperature of less than 50° C. and preferably ranging from 20° C. to 50° C.

The process according to the invention also comprises a step c) of heating in an oxidizing atmosphere, at a temperature and in a time that are sufficient to allow the formation of the expected barrier layer.

The heat treatment of step c) is carried out in an oxidizing atmosphere, more particularly in the presence of air.

Advantageously, the step is carried out in an oxidizing atmosphere at a temperature ranging from 1100° C. to 1300° C., and more particularly from 1150 to 1200° C.

More particularly, this step is carried out for a period ranging from 1 hour to 5 hours, preferably ranging from 2 hours to 3 hours.

In the context of the present invention, this heat treatment is in fact carried out at a temperature adjusted so as to make it possible to obtain sintering and in particular sintering of the silicon oxide, thereby making it possible to obtain the permeability in the appropriate range. At the end of this heat treatment, the part is left to cool to ambient temperature.

At the end of this treatment, the expected barrier layer, which is generally in the form of a silica matrix into which is incorporated the nonoxidizing part of the grains of X, is obtained. This layer may also be characterized by an oxygen weight fraction, evaluated according to the IGA technique, ranging from 25% to 40%.

According to another variant, the process according to the invention may comprise, after the treatment under an oxidizing atmosphere carried out in step c), a step of treating in the presence of a neutral gas at a temperature between 1400° C. and 1500° C.

Such a step has the effect of further reducing the porosity by creep of the silica.

A subject of the present invention is also the substrates having a coating obtained by means of the process as previously described.

In the case of crucibles intended for the manufacture of ingots, it is particularly advantageous to superpose a release layer on the barrier layer.

The substrate treated according to the invention is advantageously a crucible or a mold.

One of the advantages of the present invention is that the coating according to the invention may be used on all types of substrates, such as crucibles, molds or else wafers or lamellae, of any nature and known to those skilled in the art to be compatible with the melting of silicon without any risk of prejudicial interactions between the substrate and its content, in particular between the crucible and the liquid silicon.

Preferably, the substrate is made up of a material chosen from silicon carbide SiC, silicon nitride $Si_3N_4$, composites comprising graphite and silicon carbide or comprising graphite and silicon nitride and siliconized graphite.

According to another of its aspects, the invention also relates to the use of a crucible according to the invention or prepared according to the process of the invention in particular for solidifying silicon.

The invention will now be described by means of the following example, given of course by way of nonlimiting illustration of the invention.

EXAMPLE

A slip, consisting of 23% of a mixture of $Si_3N_4$ powder mixture, 4% of polyvinyl alcohol PVA and 73% of water, as weight percentages, is passed through a planetary mill filled with silicon carbide balls or agate balls.

Since the objective of the silicon carbide balls or agate balls is only to reduce the powder agglomerates, silicon nitride balls may also be envisaged, the risk of pollution with nitrogen being very limited.

The fluid medium thus formed is then sprayed with a spray gun (compressed air pressure of 2.5 bar, 0.4 mm nozzle placed about thirty centimeters from the substrate) onto the entire inner surface of a crucible to be coated.

The deposit thus obtained is dried with hot air at a temperature below 50° C.

A sublayer with a thickness of about 50 µm, consisting of PVA-bound powders, is thus obtained.

This layer is then subjected to a hold of 3 h at 1100° C. under air for debonding and oxidation of the powders.

Once this oxidation treatment has been carried out, the weight fraction of oxygen in the coating is 29% measured by the IGA (Interstitial Gas Analysis) technique. This technique, well known to those skilled in the art, makes it possible to establish that the corresponding volume fraction of silica is 64%, which corresponds to a silica content of 56% by weight relative to the total weight of the coating.

The weight amount of $Si_3N_4$ relative to the total weight of the mixture of silica and $Si_3N_4$, is therefore 44%.

Presented in FIG. 1 is the coating obtained at the end of example 1. This coating is in the form of a matrix of $SiO_2$ into which are incorporated nonoxidized grains of $Si_3N_4$.

The invention claimed is:

1. A crucible wherein it is at least partially surface-coated with a coating containing at least one layer, termed "barrier" layer, comprising silica and one or more material(s) X chosen from SiC, Si and $Si_3N_4$, in which layer the weight amount of X ranges from 25% to 50% relative to the total weight of the barrier layer, said barrier layer being formed from grains of one or more materials X covered at least partially with a silica shell, the barrier layer being placed in direct contact with the crucible, the barrier layer having a thickness between 10 µm and 100 µm,
   said crucible being made of a material selected from the group consisting of silicon carbide SiC, silicon nitride $Si_3N_4$, composites comprising graphite and silicon carbide or comprising graphite and silicon nitride, and siliconized graphite.

2. The crucible as claimed in claim 1, wherein the barrier layer has an open porosity ranging from 0 to 5%.

3. The crucible as claimed in claim 1, wherein the barrier layer has a permeability of less than $10^{-15}$ m$^2$.

4. The crucible as claimed in claim 1, wherein the barrier layer is in the form of a silica matrix into which are incorporated grains of one or more material(s) X.

5. The crucible as claimed in claim 1, wherein the barrier layer comprises between 50% and 75% of silica by weight relative to the total weight thereof.

6. The crucible as claimed in claim 1, wherein the specific surface area of the barrier layer is between 5 cm$^2$/g and 5 m$^2$/g.

7. The crucible as claimed in claim 1, wherein the coating also comprises, at the surface of the barrier layer, a release layer.

8. The crucible as claimed in claim 1, wherein it is a crucible for solidifying silicon.

9. A process for preparing a crucible as claimed in claim 1, said crucible being at least partially surface-coated with a coating forming a gas barrier, wherein said process comprises at least the steps:
   a) providing a fluid medium comprising at least one or more material(s) X chosen from SiC, Si and $Si_3N_4$;
   b) applying said fluid medium to the surface of the crucible in a sufficient amount to form a deposit thereon,
   c) treating said deposit under an oxidizing atmosphere, at a temperature of between 1000° C. and 1300° C. and under conditions sufficient to form a "barrier" layer comprising silica and one or more material(s) X chosen from SiC, Si and $Si_3N_4$, in which layer the weight amount of X ranges from 25% to 50% relative to the total weight of the barrier layer, said barrier layer being formed from grains of one or more materials X covered at least partially with a silica shell, the barrier layer being placed in direct contact with the crucible, the barrier layer having a thickness between 10 µm and 100 µm,
   said crucible being made up of a material chosen from silicon carbide SiC; silicon nitride Si3N4; composites comprising graphite and silicon carbide or comprising graphite and silicon nitride; and siliconized graphite.

10. The process as claimed in claim 9, wherein the fluid medium also comprises silica.

11. The process as claimed in claim 9, wherein it comprises, between step b) of forming a deposit and step c) of treating under an oxidizing atmosphere, at least one step of drying at a temperature of less than 50° C.

12. The process as claimed in claim 9 wherein the step of treating under an oxidizing atmosphere is carried out at a temperature ranging from 1100° C. to 1300° C.

13. The process as claimed in claim 9, wherein step c) of treating under an oxidizing atmosphere is carried out for a period ranging from 1 hour to 5 hours.

14. The process as claimed in claim 9, comprising, after the treatment under an oxidizing atmosphere, a step of treating in the presence of a neutral gas at a temperature of between 1400° C. and 1500° C.

15. The process as claimed in claim 9, wherein step b) is repeated several times before step c) is carried out.

16. The process as claimed in claim 9, wherein the fluid medium used in step a) comprises one or more material(s) X in an amount ranging from 15% to 35% by weight relative to the total weight of said fluid.

* * * * *